United States Patent
Nielsen

(12) 
(10) Patent No.: US 6,297,692 B1
(45) Date of Patent: Oct. 2, 2001

(54) PULSE MODULATION POWER AMPLIFIER WITH ENHANCED CASCADE CONTROL METHOD

(75) Inventor: Karsten Nielsen, Struervej 109D, Holstebro (DK), DK-7500

(73) Assignees: Bang & Olufsen A/S, Struer; Karsten Nielsen, Holstebro, both of (DK)

(*) Notice: Subject to any disclaimer, the term of this patent is extended or adjusted under 35 U.S.C. 154(b) by 0 days.

(21) Appl. No.: 09/297,058

(22) PCT Filed: Oct. 31, 1997

(86) PCT No.: PCT/DK97/00497

§ 371 Date: Jun. 24, 1999

§ 102(e) Date: Jun. 24, 1999

(87) PCT Pub. No.: WO98/19391

PCT Pub. Date: May 7, 1998

(30) Foreign Application Priority Data

Oct. 31, 1996 (DK) .................................................... 1214/96

(51) Int. Cl.$^7$ .................................................... H03F 3/38
(52) U.S. Cl. .......................................... 330/10; 330/207 A
(58) Field of Search ................................ 330/10, 207 A, 330/251, 207 R

(56) References Cited

U.S. PATENT DOCUMENTS

| | | | |
|---|---|---|---|
| 4,021,745 | 5/1977 | Suzuki et al. | 330/10 |
| 4,134,076 | 1/1979 | Suzuki et al. | 330/10 |
| 4,178,556 | * 12/1979 | Attwood | 330/10 |
| 4,504,793 | * 3/1985 | Yokoyama | 330/10 |
| 4,524,335 | * 6/1985 | Yokoyama | 330/10 |
| 4,531,096 | 7/1985 | Yokoyama | 330/10 |
| 4,724,396 | 2/1988 | Taylor, Jr. et al. | 330/20 |
| 5,218,315 | * 6/1993 | Turner | 330/10 |
| 5,352,986 | * 10/1994 | Modgil et al. | 330/10 |
| 5,805,020 | * 9/1998 | Danz et al. | 330/10 |
| 5,949,282 | * 9/1999 | Nguyen et al. | 330/10 |
| 6,064,259 | * 5/2000 | Takita | 330/10 |

FOREIGN PATENT DOCUMENTS

WO 97/15170    4/1997  (WO).

* cited by examiner

*Primary Examiner*—Robert Pascal
*Assistant Examiner*—Khanh Van Nguyen
(74) *Attorney, Agent, or Firm*—Nixon Peabody LLP; David S. Safran

(57) ABSTRACT

A digital switching power amplifier with Multivariable Enhanced Cascade Controlled (MECC) includes a modulator, a switching power stage and a low pass filter. In the first preferred embodiment an enhanced cascade control structure local to the switching power stage is added, characterised by having a single local feedback path A (7) with a lowpass characteristic and local forward blocks $B_1$ or B (3, 4). The leads to a much improved system with a very low sensitivity to errors in the switching power stage. In the second preferred embodiment of the invention the control structure is extended with a global structure composed of a single feed-back path C (8) and forward paths blocks D1 or D (1, 2). This provides further improvements and a very low sensitivity to load variations and filter errors. Both MECC embodiments are characterised by being simple in implementation, stable and extendible by adding/removing simple local (3) or global (1) forward path blocks. A third embodiment of the invention is a controlled self-oscillating pulse modulator, characterised by first a non-hysteresis comparator as modulator and second by a higher order oscillating loop realized in both forward path B1 and feedback path A to determine stable self-oscillating conditions. An implemented 250W example MECC digital power amplifier has proven superior performance in terms of audio performance (0.005% distortion, 115 dB dynamic range) and efficiency (92%).

24 Claims, 15 Drawing Sheets

PULSE MODULATION POWER AMPLIFIER WITH ENHANCED CASCADE CONTROL METHOD

TECHNICAL FIELD

This invention relates to a power amplifier for the audio frequency range, comprising a pulse modulator, a power amplifier stage for amplifying the modulated signal, the output of which is low pass filtered in a demodulation filter for obtaining an analog output to feed to a consumer.

1. Background

Nearly all commercially available power amplifiers for frequencies in the above range are of the linear analog type: class A, AB, and B. Since the output transistors of such amplifiers operate in the linear region, they have a low efficiency and dissipate a considerable amount of heat. The basic pulse modulation ("digital") switching class D power amplifier method in theory provides a much higher efficiency, which lowers the amplifier volume and heat development. Despite this efficiency advantage, prior art in the field has not provided solutions with an acceptable audio quality, that could make them generally useful and direct replacements for analog amplifiers. Accordingly, the use of digital power amplification has been limited to applications where the demands for output quality are low. The reasons for this will be presented in the following, when the general prior art principles are discussed.

2. Prior Art

There is a fundamental requirement for efficient control systems to eliminate errors generated in the various blocks of the digital switching power amplifier. In the basic digital power amplifier the input signal is modulated into a pulse modulated signal. A switching power stage performs amplification of the signal, and a low pass filter regenrates the modulated but now amplified signal. The basic method form the basis for a range of prior art arrangements. However, there are numerous non-ideal features with this method:

Any modulator errors are fed directly to the load.

Any power stage errors are fed directly to the load.

There is no rejection of power supply perturbations. Since the power stage output is largely proportional to the supply voltage, any supply ripple will intermodulate with the audio signal.

The post filter errors will introduce further distortion, since magnetic core materials are not ideal.

The total output impedance is high, especially at high frequencies, due to the filter.

The sensitivity to load variations is high due- to the passive post filter. Accordingly, changes in load impedance will distort the frequency response of the amplifier.

The sensitivity to temperature drift, component tolerances, and aging effects is high. The non-controlled digital switching amplifier is therefore not robust and reliable.

Compensation for these major problems areas is absolutely vital, if very high fidelity is to be obtained. Prior art methods are based on two different control methods, characterized by having a single feedback loop.

One basic principle is to feed back the amplifier output. However, the poles of the low pass filter cause a large phase shift which puts strong restrictions on loop design. Consequently, reasonable loop bandwidths requires high switching frequencies. This causes several problems, such as lower efficiency, and poor performance due to the first two errors mentioned above.

Another basic principle of feedback in prior art, is single loop feedback before the filter network, whereby the phase lag of the post filter is avoided. However, the high frequency content at the power stage output makes the feedback source potentially very noisy. Furthermore, a number of the above errors are not (or only partially) compensated The fundamental problem of both methods are the conflicting desires for a low carrier frequency, high gain-bandwidth product and good stability characteristics in all situations. A further problem with prior art arrangements is the apparent complexity of the system, partially caused by inefficient control.

The following publications are relevant as background material and illustration of the methods and the problematic issues of three prior art arrangements:

[1] Suzuki, T.: Pulse Width Modulated Signal Amplifier. U.S. Pat. No. 4021745 (1977)

[2] Yokoyama, K.: Pulse-Width Modulation Circuit. U.S. Pat. No. 4531096 (1986)

[3] Attwood, B. E.: Design Parameters Important for the Optimization of Very High-Fidelity PWM (Class D) Audio Amplifiers , Journal of the AES, Nov. 1983. p. 842–853.

[4] Taylor, W. E. Digital Audio Amplifier. U.S. Pat. No. 4724396 (1988).

[5] Hancook, J.: A class D Amplifier Using MosFET's with Reduced MinorityCarrier Lifetime , $89^{th}$ Convention of the AES. Los Angeles. Calif. Sep. 21–25. 1991.

[6] Solomon, E. E : Digital Power Amplifier. U.S. Pat. No. 5126684 (1992).

[7] McCorkle, D. P. Class D amplifier. European Patent. Publ. No. 557032A2 (1993).

[8] Nakajima, Y. Pulse-Width Modulation amplifier. European Patent. Publ. No.503571A1 (1993).

[9] Leigh, S. P et al. Distortion analysis and reduction in a completely digital PWM class D power amplifier, International Journal of Modeling & Simulation, Vol. 14, No. 2, 1994.

OBJECTIVES

According to the above stated problems that exist with prior art arrangements, the primary objective of the present invention is to provide a pulse modulation amplifier which can deliver very high power outputs, and still provide ultra low distortion (less than 0.01% and noise (less than 100 $\mu V$ RMS), and yet a very high efficiency (90–95%) and low idle losses.

Another objective of the invention is to maintain low complexity by avoiding the use of advanced but complex and hence potentially unreliable circuitry, and also to eliminate the requirement for tuning in production.

Another important objective of the invention is to eliminate the need for a stabilized supply, meaning that a simple non-regulated bridge rectifier with a stabilizing capacitor is sufficient. In this way, a minimal complexity and maximal efficiency is secured from the mains input to the amplifier output terminals.

The final objective of the invention is to obtain minimal sensitivity to load variations, and furthermore to provide robustness and reliability.

SUMMARY OF TEE INVENTION

The above objectives are obtained with the present invention. In the first preferred embodiment, an amplifier according to the invention is particular in that negative feedback is introduced from the switching power stage output to one or several loops feeding into one or several pre-amplifier stages preceding the modulator. This offers a range of advantages that are new to the art, in terms of performance and stability control. A further embodiment of the invention is particular in that the local feedback has a enhanced cascaded structure with a single feedback path, that comprises a filter with a phase characteristic such that a pole in the demodulation filter is compensated.

Another embodiment of the invention is particular in that further feedback is established from the output of the demodulation filter to one or several pre-amplifier stages, so that the pulse modulation ("digital") switching power amplifier circuit elements are enclosed by an enhanced cascade structure of feedback loops, providing further improved performance and stability control.

A further embodiment of the invention is particular in that the pulse modulator-is a controlled self-oscillating modulator comprising a non-hysteresis comparator for pulse modulation, and a higher order oscillating loop realized by means of two poles, preferably a pole in the first (local) forward path and feedback path. This provides en extremely simple and stable configuration, obviating the need for a separate carrier frequency generator.

A further embodiment of the invention is particular in that the pulse modulator is a carrier based modulator. This means that well-known design techniques for carrier based modulators may be used in the configuration according to the invention.

A further advantageous embodiment of the invention when carrier based modulation is used, is particular in that a notch filter is provided in the single feedback path block between the amplifier and the loops. Thereby it is possible to simplify the filtering out of the carrier frequency influences on the system performance in carrier based systems. A similar result is obtained in a further advantageous embodiment of the invention which is particular in that a structure creating a high frequency pole is provided in the feedback path block.

BRIEF DESCRIPTION OF THE DRAWINGS

The invention will be further described with reference to The drawings, in which.

FIG. 13(a) shows power efficiency. At 250 kHz switching frequency the efficiency approaches 92%, and with 50 kHz switching frequency the efficiency approaches 96%.

FIG. 14(b) shows the very low measured Total harmonic distortion+Noise (THD+N) vs. output power at 100 Hz, 1 KHz and 10 KHz (top curve).

FIG. 14(c) shows the measured amplifier noise. The noise floor at –150 dB corresponds to an RMS noise level of only 70 $\mu$V.

DETAILED DESCRIPTION

Figure 1:
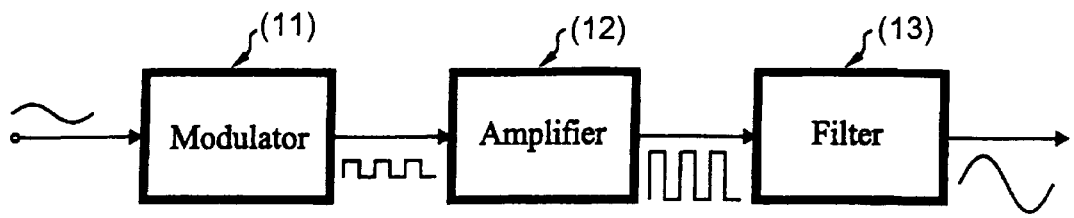
FIG. 1 shows the principle in prior art conventional pulse modulation ("digital") switching power amplifiers

The basic "digital" power amplifier is shown in FIG. 1. The input signal is modulated (11) into a pulse modulated signal. A switching power stage (12) performs amplification of the modulated signal, and a low pass filter (13) regenerates the audio waveform.

Figure 2:
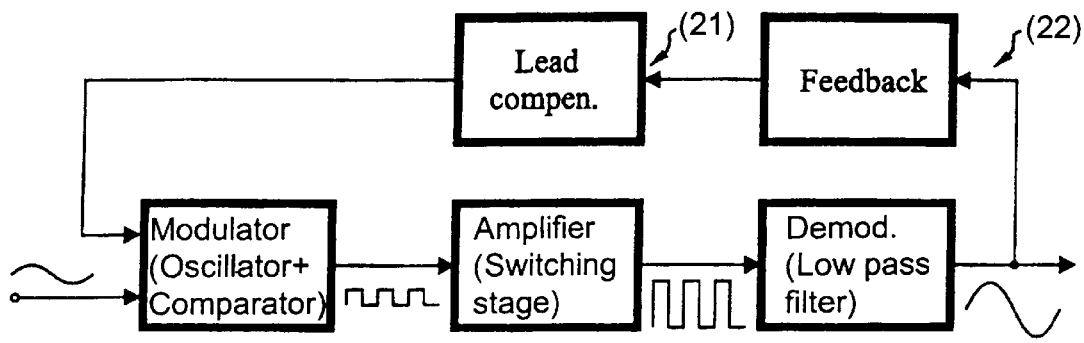
FIG. 2 shows a prior art method with single loop feedback based on the overall amplifier output as the feedback source

A first category of prior art control principle is shown in FIG. 2. This displays the basic problems: that a reasonable gain-bandwidth product requires very high switching frequencies due to post filter phase lag and the lack of local correction schemes. Reasonable gain-bandwidth product at all frequencies within the amplifier bandwidth is impossible to obtain.

Figure 3:
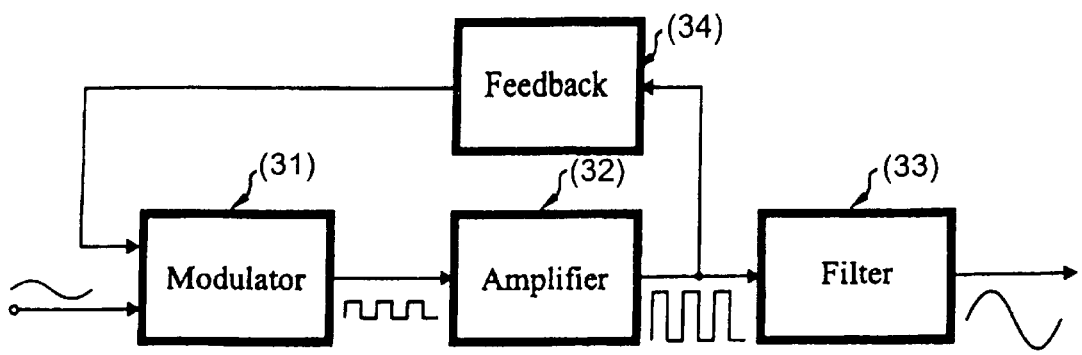
FIG. 3 shows a prior art single loop feedback with power stage output as the feedback source

FIG. 3 shows a second category of prior art control principles which displays the following basic problems: noisy feedback source, no post filter error correction, load sensitivity and limited loop gain-bandwidth product caused by single loop control.

Figure 4:
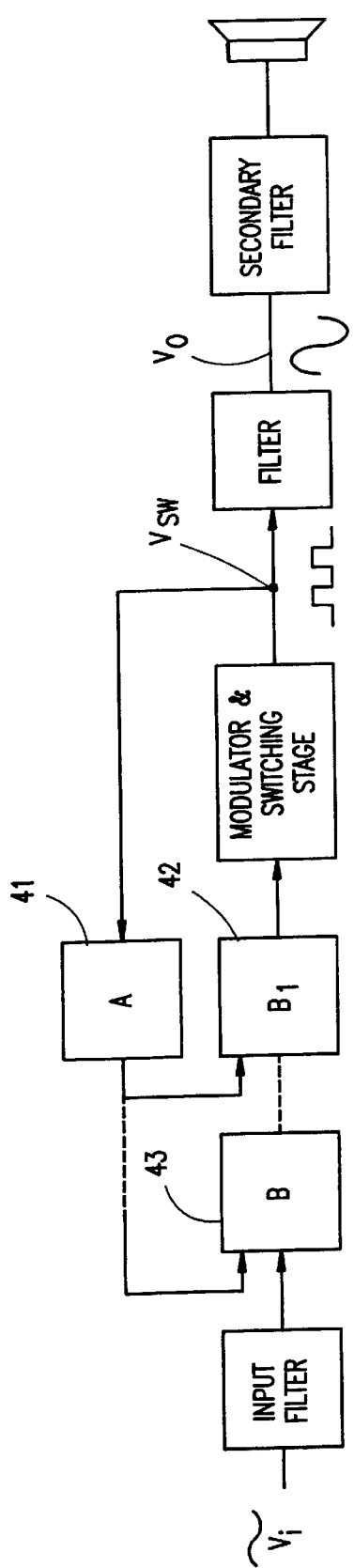
FIG. 4 shows the a general block diagram of a first embodiment of the present invention, a digital switching amplifier improved by an Multivariable Enhanced Cascade Controller (MECC) based on single feedback from the switching power stage output.

FIG. 4 illustrates the first embodiment of the invention. The basic pulse modulation ("digital") switching power amplifier circuit elements are enclosed by an enhanced cascade (or nested) structure of feedback loops. This first embodiment is termed a (single feedback) Multivariable Enhanced Cascade Controlled (MECC) digital power amplifier. The control structure is characterized first by having a single feedback source and second by a single feedback path A (7) having a lowpass characteristic. The control structure is simple in implementation since it consists of a single feedback path A and a set of forward path blocks $B_i$. Using preferred loop design procedures, each loop has a very stable 1st order characteristic and the forward path blocks are preferably simple. MECC offers a range of advantages that are new to the art:

A higher order control system combined with a high level of stability and robustness, since each loop considered individually is very stable.

The enhanced-cascade control method provides hitherto unknown freedom in loop design and optimization possibilities. Thus, the equivalent loop gain bandwidth at any frequency can as such be increased infinitely relative to single loop systems without compromising stability.

The lowpass characteristic of the feedback path provides a closed loop zero-pole lead characteristic that can be designed to cancel one of the filter poles. The result is a much improved system for global feedback.

Each loop individually reduces the sensitivity to power stage errors and improves system performance (distortion, noise . . . ) by a factor corresponding to the loop gain. MECC provides an equivalent feedback corresponding to the product of contributions of each loop.

Successive improvement by multiple loops is more efficient than in a one loop realization.

Frequencies of unity loop gain in each loop can be reduced compared to single loop system, while still providing improved performance. Thus, the switching frequency can be reduced.

MECC has low requirements for dynamic range of the individual compensator blocks A and Bi. Using preferred design procedures, the signal levels throughout the control system will have a level similar to the input signal.

Figure 5:
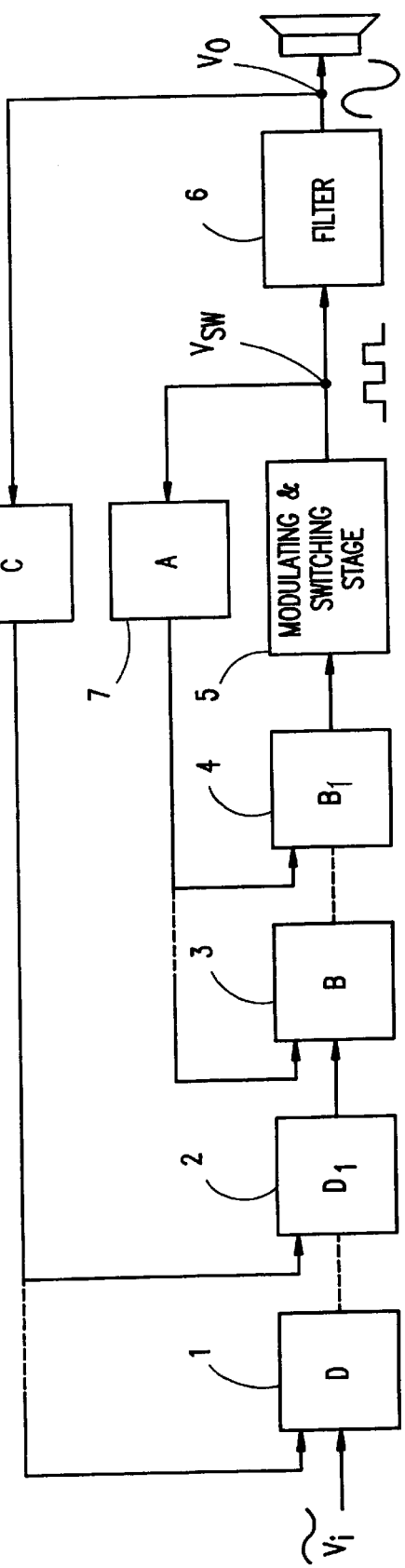
FIG. 5 shows a general block diagram of a second embodiment of the present invention, FIG. 6a and 6b exemplify general recursive loop synthesis methods for the first (FIG. 6a) and second (FIG. 6b) embodiments of the invention.

The second embodiment of the invention involves the extension of the first embodiment to a dual feedback Multivariable Enhanced Cascade Control (MECC)structure, were the two cascades are closely connected. A general block diagram is illustrated in FIG. 5. The system relies on the zero-pole lead characteristic caused by the single lowpass feedback path of the local enhanced cascade. Dual feedback MECC provides further improvements to the system. The system bandwidth is increased beyond the demodulation filter bandwidth limit. This minimizes phase and amplitude distortion within the audio band. Furthermore, the transient response is improved. Post filter errors are corrected, meaning that the requirements for filter inductor linearity is low. Furthermore, the output impedance is reduced considerably, and so is the sensitivity to load variations.

A third embodiment of the invention is a forced self-oscillating pulse width modulator, characterized by first a non-hysteresis comparator as a modulator and secondly by a higher order oscillating loop realized with both forward path B1 and feedback path A to determine self-oscillating conditions.

A fourth embodiment of the invention is an alternative carrier based three-level pulse width modulator with attractive characteristics in combination with MECC.

Further embodiments of the invention include:

Means for obtaining improved elimination of noise from the noisy feedback by using a notch filter and high frequency poles in the local feedback or alternatively forward path. This improves distortion when carrier based pulse width modulation is used.

Means for compensating for large scale power supply regulation, in order to obtain improved stability and efficiency improvements at all output levels. This is relevant with carrier based modulation, where the gain of modulator and power stage is dependent on the power supply rail level, meaning that the power supply perturbation may influence stability unless such precautions are taken.

DESCRIPTION OF THE FIRST EMBODIMENT

Figure 6A:
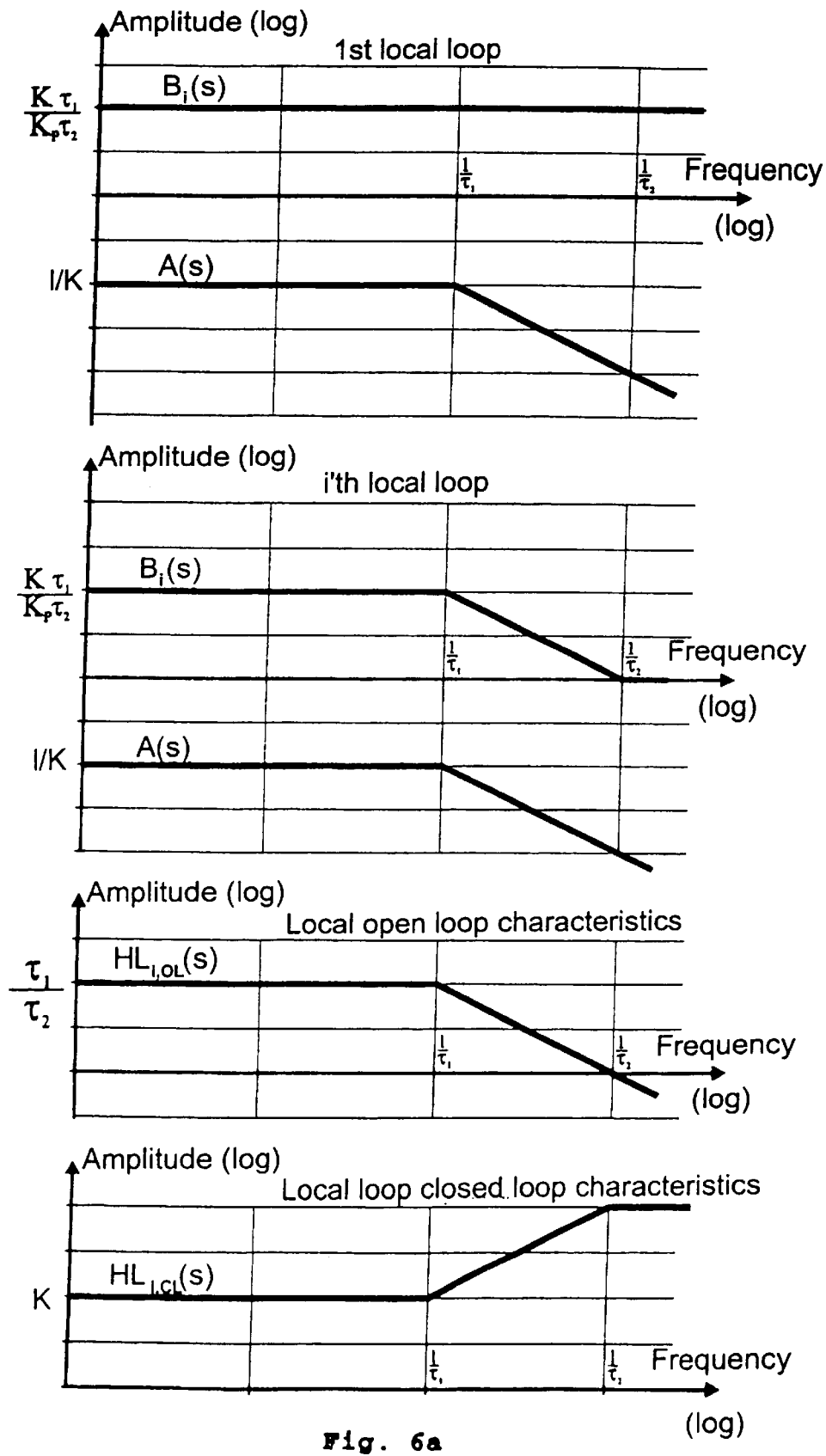

The enhanced cascade control method new to the art relies on the fact that the modulator and amplifier can be represented by a constant gain Kp over a wide bandwidth. One general recursive approach to design the local cascade is illustrated in FIG. 6a. The feedback path has a lowpass characteristic:

$$A(s) = \frac{1}{K} \frac{1}{\tau_1 s + 1} \quad (1)$$

The lowpass characteristic of the feedback path is beneficial in several aspects. It causes a closed loop zero-pole phase lead characteristic which can be very useful for realizing a cancellation of one of the poles of the demodulation filter. Furthermore, the pole causes an important filtering of the high frequency switching noise from the power stage output, which is essential when carrier based modulation methods are used (the fourth embodiment of the invention). In this simple exanplary embodiment the initial forward block is a simple gain, with a gain that leads to a constant open loop and closed loop gain of K in the frequency band of interest:

$$B_1(s) = \frac{K}{K_P} \frac{\tau_1}{\tau_2} \quad (2)$$

Whereas the i'th block has a pole-zero characteristic to compensate for the zero-pole characteristic of the preceding loop:

$$B_i(s) = \frac{\tau_1}{\tau_2} \frac{\tau_2 s + 1}{\tau_1 s + 1} \quad (3)$$

By this realization the open loop gain of the single loop configuration can be written by the following 1. order expression:

$$HL_{1,ol}(s) = K_P A(s) B(s) \quad (4)$$

$$= K_P \frac{1}{K} \frac{1}{\tau_1 s + 1} \frac{K}{K_P} \frac{\tau_1}{\tau_2}$$

$$= \frac{1}{\tau_1 s + 1} \frac{\tau_1}{\tau_2}$$

It is easy to show that for all loops:

$$HL_{i,ol}(s) \cong HL_{1,ol}(s) = \frac{\tau_1}{\tau_2} \frac{1}{\tau_1 s + 1} \quad (5)$$

The closed-loop transfer function can be approximated to:

$$HL_{i,cl}(s) \cong K \frac{\tau_1 s + 1}{\tau_2 s + 1} \quad (6)$$

By this specified simple loop synthesis procedure, each loop will exhibit identical and stable 1st order behaviour as illustrated in FIG. 6a.

Numerous alternative approaches to loop synthesis can be devised. The recursive design procedure specified above provides a frequency independent loop gain at all frequencies within the target bandwidth, irrespective of the number of cascaded loops and the loop unity gain frequency. Instead of a constant loop gain, each loop can realize e.g. an integrator. Alternatively, each loop can be designed using two pole compensation. Both methods lead to a considerably higher but frequency dependent loop gain within the frequency band of interest.

Alternative variants of single feedback MECC power amplifier include the use of alternative different feedback paths A, which are optimized in respect to noise attenuation, which is essential in systems where carrier based modulation is used. If HF components related to the switching frequency were to reach the modulator, it would be impossible to obtain a pulse width according to the instantaneous amplitude of the audio signal. By introduction of a notch filter, the first critical component and intermodulation components can be eliminated. The specific placement of the notch filter in the feedback path effectively eliminates the switching fundamental in all loops. By further addition of a high frequency pole in block A, a 2nd order attenuation characteristic of the higher order harmonics of the switching frequency in the feedback path is realized, and the noise attenuation is thereby further improved. A further advantage of placing the noise attenuating circuitry in the feedback path is, that it will only have a local effect for each loop, if the unity loop gain frequency and switching frequency are properly chosen. The noise elimination circuitry operates well above unity loop gain, and does therefore not influence the closed loop behavior of any of the loops.

DESCRIPTION OF THE SECOND PREFERRED EMBODIMENT

The second embodiment of the invention involves the extension of the first embodiment to a dual feedback Multivariable Enhanced Cascade Control (MECC)structure, were the two cascades are closely connected. A general block diagram is illustrated in FIG. 5. The system relies on the zero-pole lead characteristic caused by the single low-pass feedback path of the local enhanced cascade. Due to the use of two feedback sources, this embodiment is termed Dual feedback Multivariable Enhanced Cascade Control. The second cascade has the same special characteristics as the first cascade with only one single feedback path C and a set of forward path blocks $D_i$. One preferred approach of dual feedback MECC design is based on the local enhanced cascade in FIG. 6a and illustrated in FIG. 6b. The main reconstruction filter F(s) is assumed to be 2. order. The feedback path has a constant gain characteristic:

$$C(s) = \frac{1}{K} \tag{7}$$

The initial block forward block $D_1$, is a simple gain block with a gain in the frequency band of interest:

$$D(s) = \frac{\tau_1}{\tau_2} \tag{8}$$

Whereas the i'th forward block has a pole-zero characteristic:

$$D_i(s) = \frac{\tau_1}{\tau_3} \frac{\tau_3 s + 1}{\tau_1 s + 1} \tag{9}$$

Figure 6B:
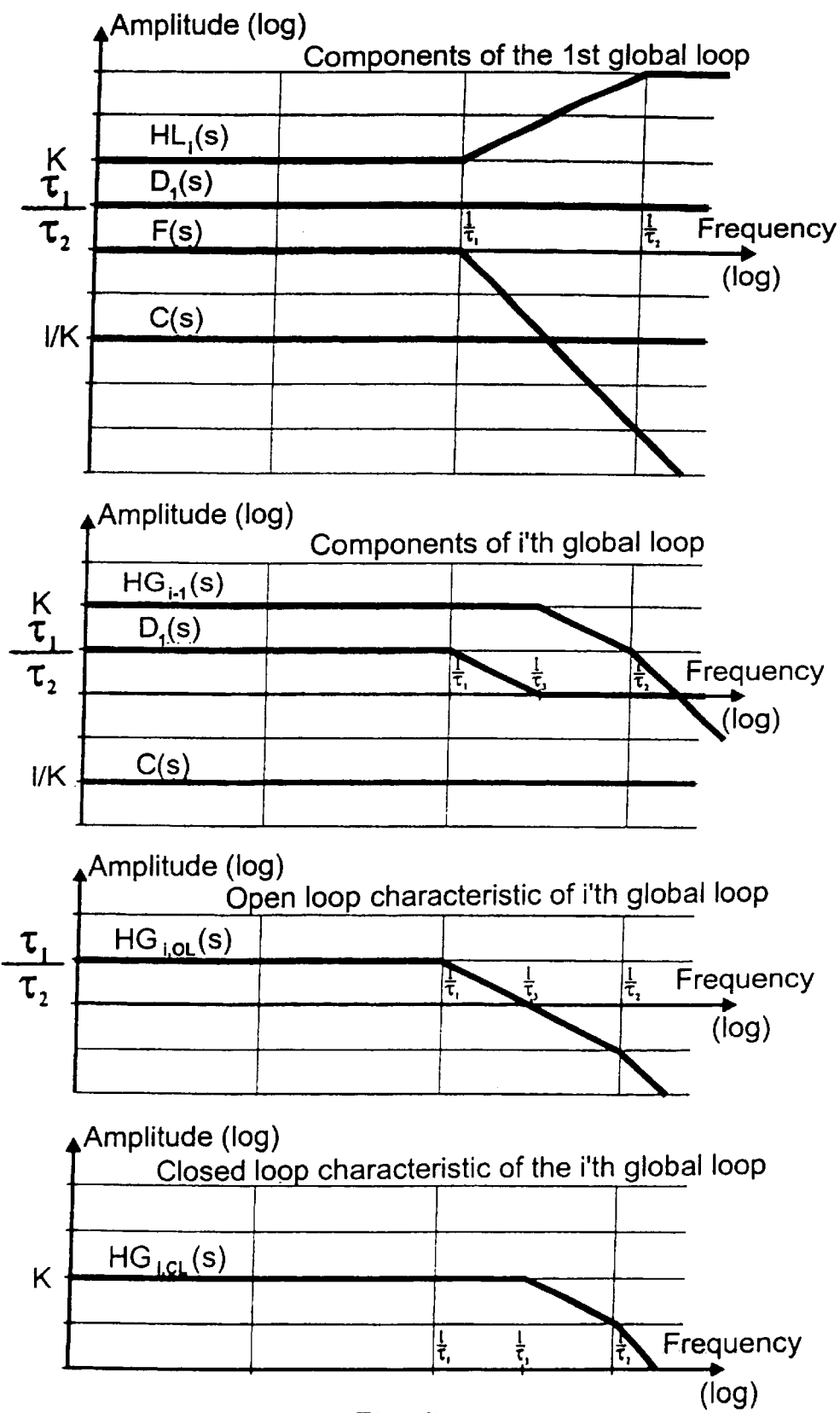

By this simple recursive design procedure, each loop will exhibit identical behavior, which is illustrated by both the open loop $HG_{i,OL}(s)$ and closed loop characteristics $HG_{i,cl}(s)$ in FIG. 6b:

$$HG_{i,ol}(s) \cong HG_{1,ol}(s) = \frac{\tau_1}{\tau_3} \frac{1}{(\tau_1 s + 1)(\tau_2 s + 1)} \tag{10}$$

The closed-loop transfer function can be approximated to:

$$HG_{i,cl}(s) \cong \frac{K}{(\tau_3 s + 1)(\tau_2 s + 1)} \tag{11}$$

It should be emphasized, that the given design approach is mainly illustrative, .and that there are numerous possible extensions which will be apparent to the skilled person, e.g. a first order characteristic in each loop to improve correction for errors at lower frequencies.

To maximize the robustness of the dual feedback MECC Digital power amplifier, the number of global loops should be minimized and preferably only one global loop should be used. Tuning towards the desired distortion and noise characteristics should be carried out by adjusting the number of local loops, since the dominating errors are introduced in the switching power stage block, and should therefore be corrected locally.

A fundamental advantage of the powerful Multivariable Enhanced Cascade Control method in both embodiments is, that design of modulator, power stage, post filter and power supply can be relaxed considerably without compromising audio performance. These fundamental elements can be implemented with simple standard components and thereby have a low cost and complexity.

The control method comprising first and embodiment of this invention functions independently of the pulse modulator and power stage realization. The only requirement for theses two blocks is that they realize an amplification of the analog modulator reference input over a frequency range that is wider that the desired bandwidth. Thus, the modulation may be single sided or double sided, two level or multilevel pulse width modulation, or even alternative modulation schemes such as Sigma-Delta modulation.

THE THIRD EMBODIMENT OF THE INVENTION

Figure 10:
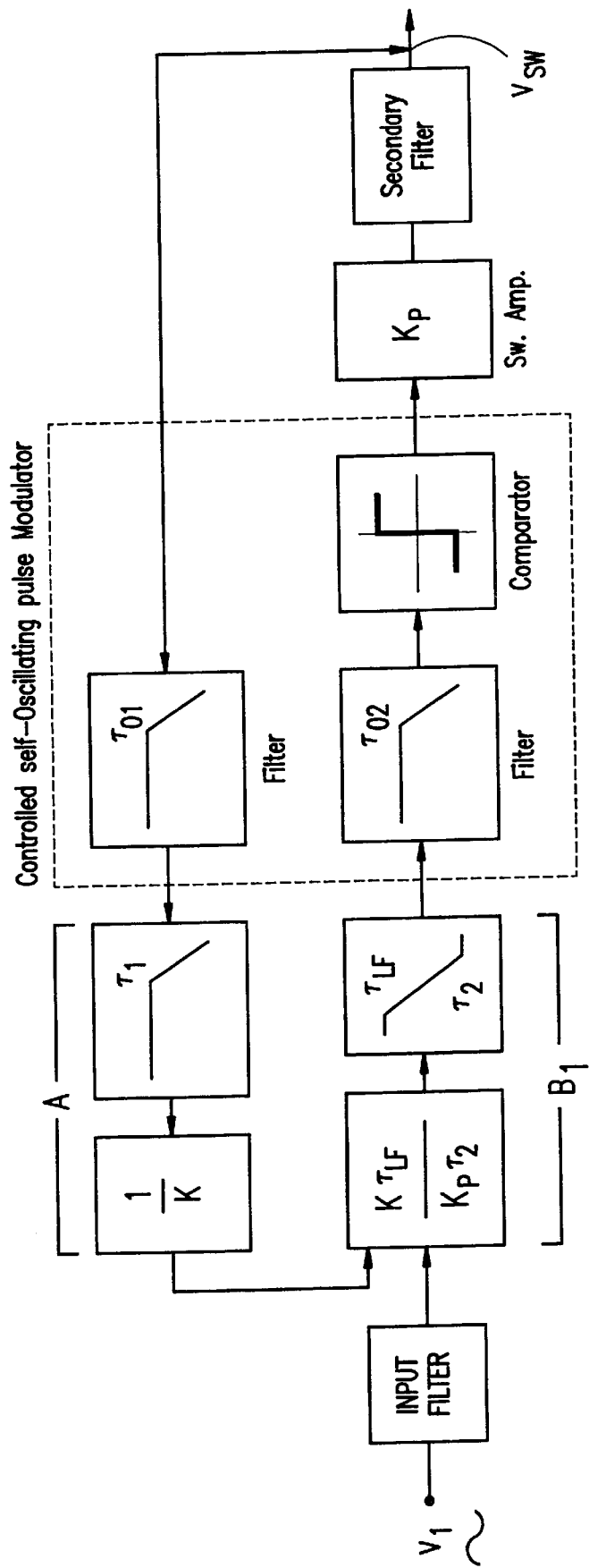
FIG. 10 illustrates the third embodiment of the present invention, the controlled self-oscillating pulse modulator characterized by a non-hysteresis comparator and additional poles in the first local loop to secure self-oscillating conditions.
Figure 11A:
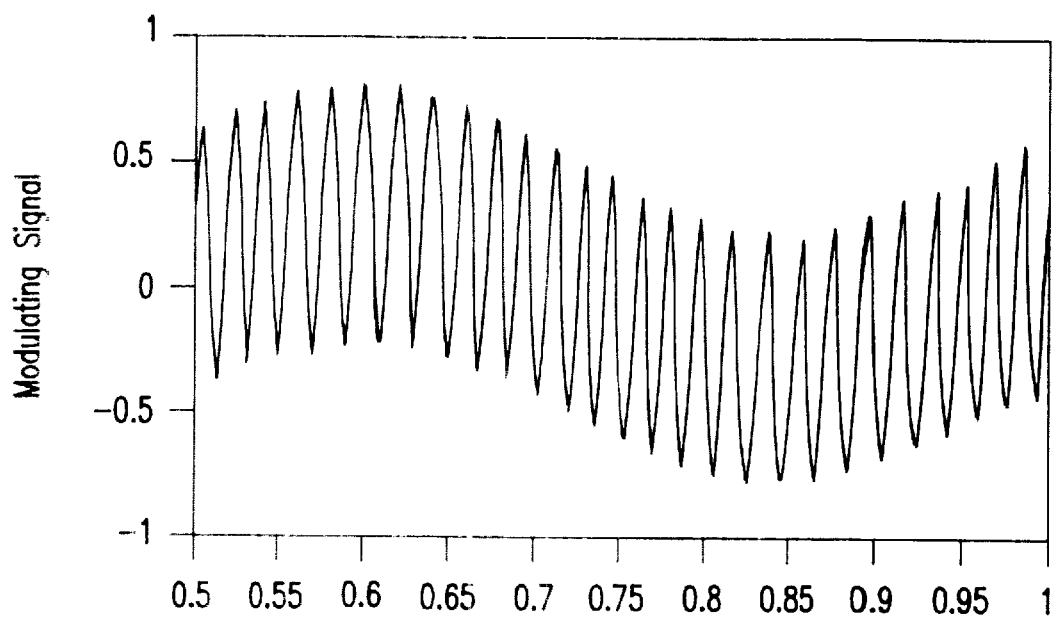
FIGS. 11(a)–(b) show essential signals of the third embodiment of the invention, the controlled oscillating pulse modulator.
Figure 11B:
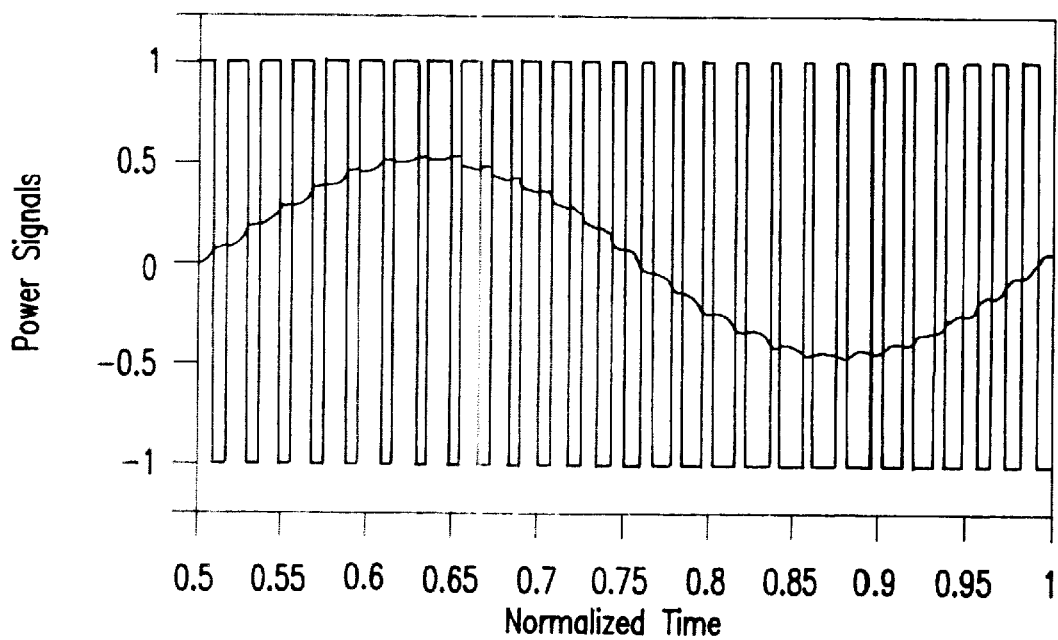

A further preferred embodiment regarding modulator implementation for the MECC digital power amplifier is a Controlled self-Oscillating Pulse Modulator, new to the art. An example of an embodiment realizing this method is shown in FIG. 10. The preferred method is characterized by having a non-hysteresis comparator as a modulator and by modifying the first local loop to a have higher order characteristic, by an additional pole in both forward path block $B_1$ and feedback path A. This secures controlled and stable self-oscillating conditions. The desired pulse modulation effect is then obtained by superposing the oscillating signal with the signal input ($V_i$). FIG. 11 shows an example of the signal characteristics at the reference point for the modulator where the oscillating signal is superposed with the input signal. Furthermore, the pulse modulating effect is shown.

Advantages of the above described Controlled self-Oscillating Pulse Modulator over constant frequency carrier based methods are several. First, the modulator is extremely simple to implement since no carrier generator is needed. Secondly, the bandwidth of the unity gain frequency of the first local loop is the oscillation frequency leading to wide bandwidth control even with modest switching frequencies. Third, power supply rail no longer determines the equivalent gain of the modulator/power stage meaning that large scale power supply perturbation is automatically cancelled, and does no longer influence stability in other loops in the enhanced cascade structure. The unity gain frequency of the local loop is inherently determined by the frequency of positive feedback, i.e. the control loop bandwidth is considerably wider than in traditional carrier based systems, where a rule of thumb is a factor of three between unity gain frequency and carrier frequency.

OTHER EMBODIMENTS

Figure 12:
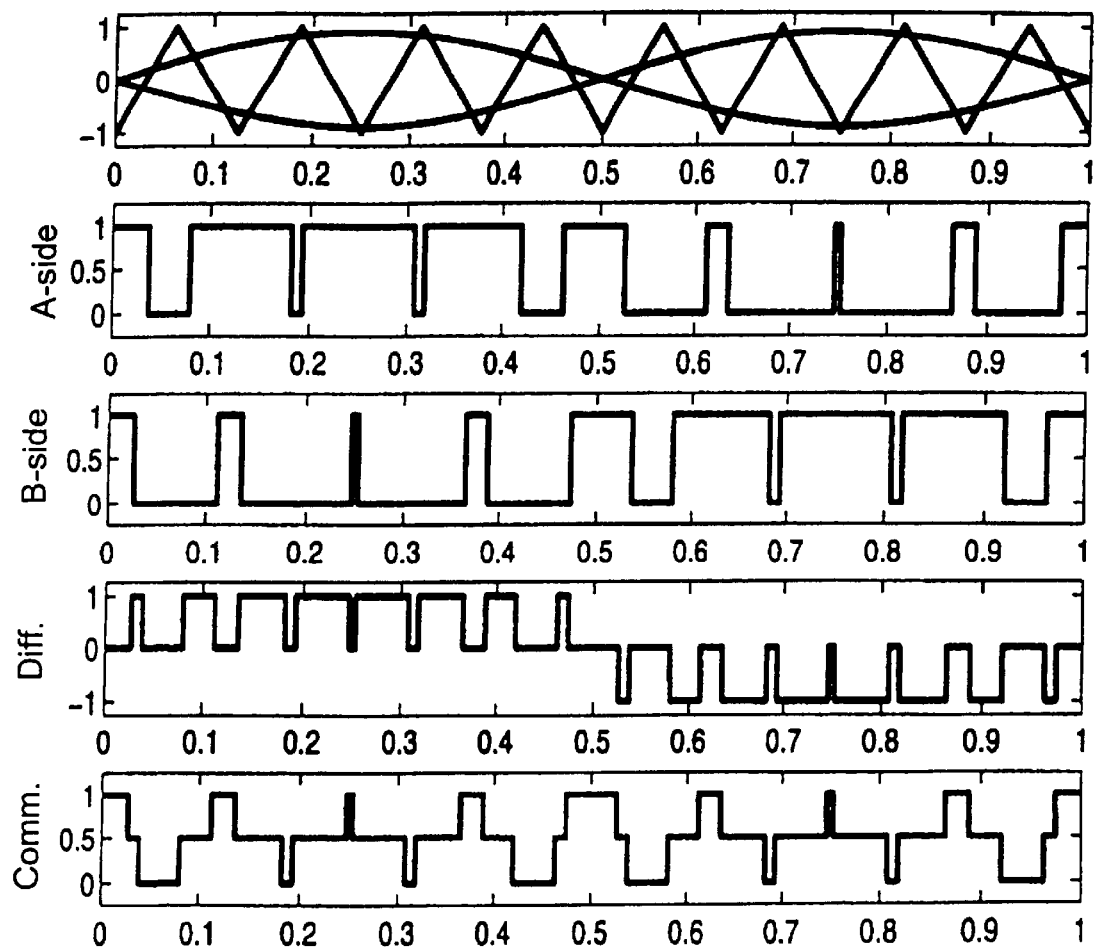
FIG. 12 illustrates the principle of a fourth embodiment of the invention, an alternative three-level pulse width modulator for implementation with a 4 transistor bridge power stage. The signals are from top to bottom: Modulating signals, normalized voltage on each phase in a bridge power stage (A,B), and finally both the normalized differential and common mode output signals (A–B and A+B). The difference signal is fed to the load.
Figure 13A:
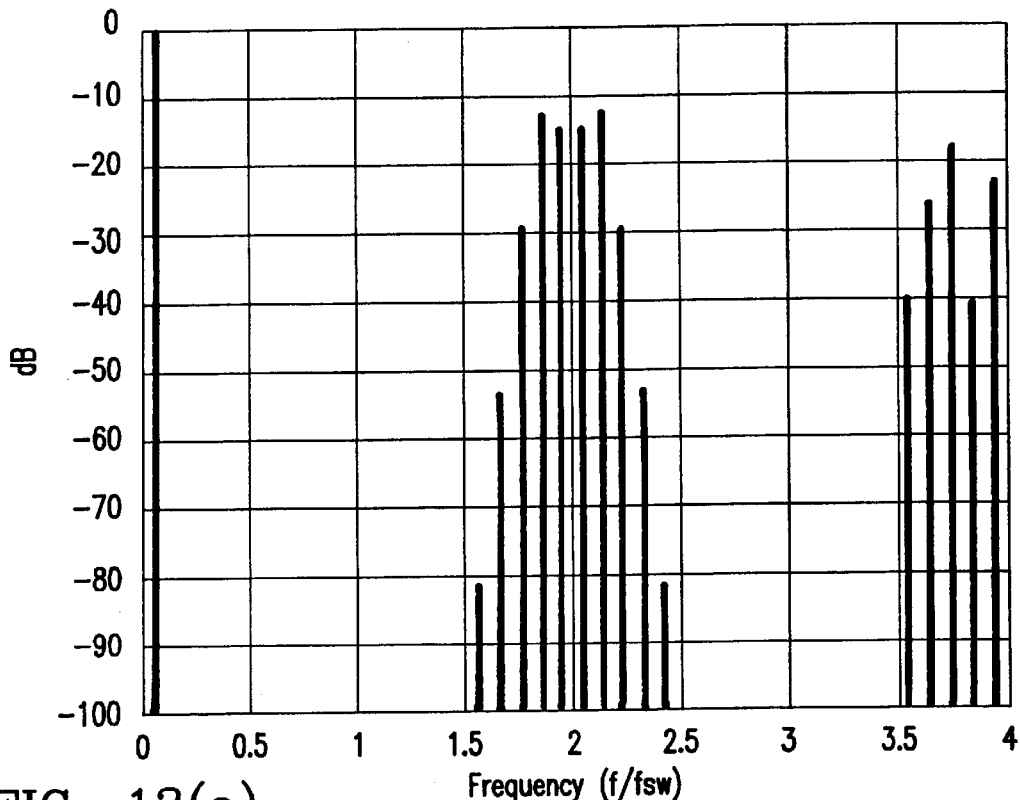
FIGS. 13(a)–(b) illustrates the spectral characteristics of the alternative three-level modulator. The output amplitude spectrum is shown 0 dB and –60 dB relative output levels.
Figure 13B:
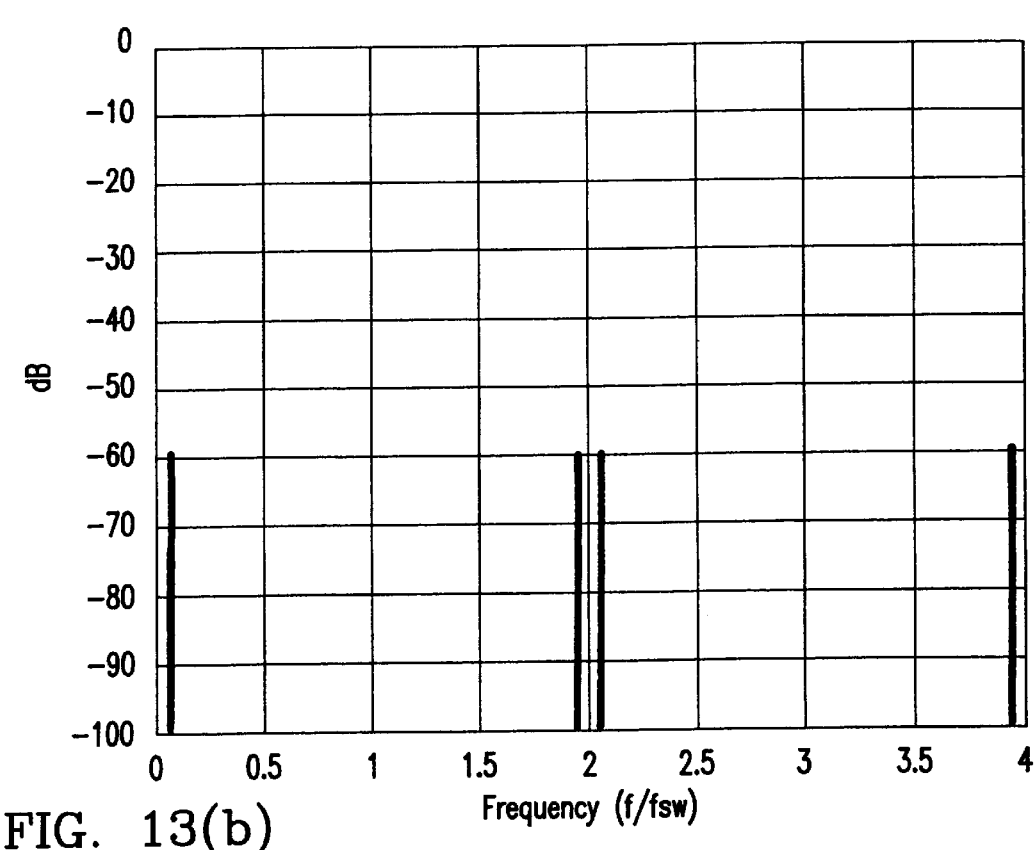

Other embodiments of the of invention include the use of pulse width modulation, preferably with three discrete amplitude levels. To aid in this understanding this alternative embodiment regarding modulator implementation, FIG. 12 illustrates the essential time domain waveforms and FIG. 13 the frequency domain spectral amplitude characteristics. From FIG. 12 it is obvious that by using three-level PWM the effective sampling frequency is doubled since there are two samples pr. switch cycle. This is obtained without increasing the power losses, since each transistor operates at a rate equal to the switching frequency. Accordingly, three-level PWM allows the loop bandwidths to be increased or alternatively the switching frequency to be decreased.

A further embodiment of the invention relates to the case where MECC is combined with constant frequency carrier based modulation, and is characterized by the design change described hereinafter. Improved means to compensate for any large scale variations of the power supply voltage is obtained by intelligent automatic gain adjustments in the first local loop. The equivalent gain of the modulator and power stage, $K_p$, is largely proportional to the power supply voltage. Accordingly, the gain of $B_1$, should be regulated inversely proportional to the supply voltage variation:

$$B_1(K_P) = \frac{K}{K_P} \frac{\tau_1}{\tau_2} \quad (12)$$

This design change will have a further stabilizing effect on the digital power amplifier based on MECC since the characteristics of the first loop will be independent power supply perturbations. Large perturbations of the power supply voltage will not influence stability. The adaptive adjustment of the power supply allows an intelligent control of the power rail voltage e.g. controlled by the volume control without compromising stability. This can be utilized to secure optimal efficiency at all output levels.

Further embodiments include additional secondary filtering circuitry on the amplifier output for further elimination of switching components, and the addition of an input filter to shape the overall amplifier response in frequency and time.

EXAMPLES OF THE FIRST AND SECOND EMBODIMENT

Figure 7:
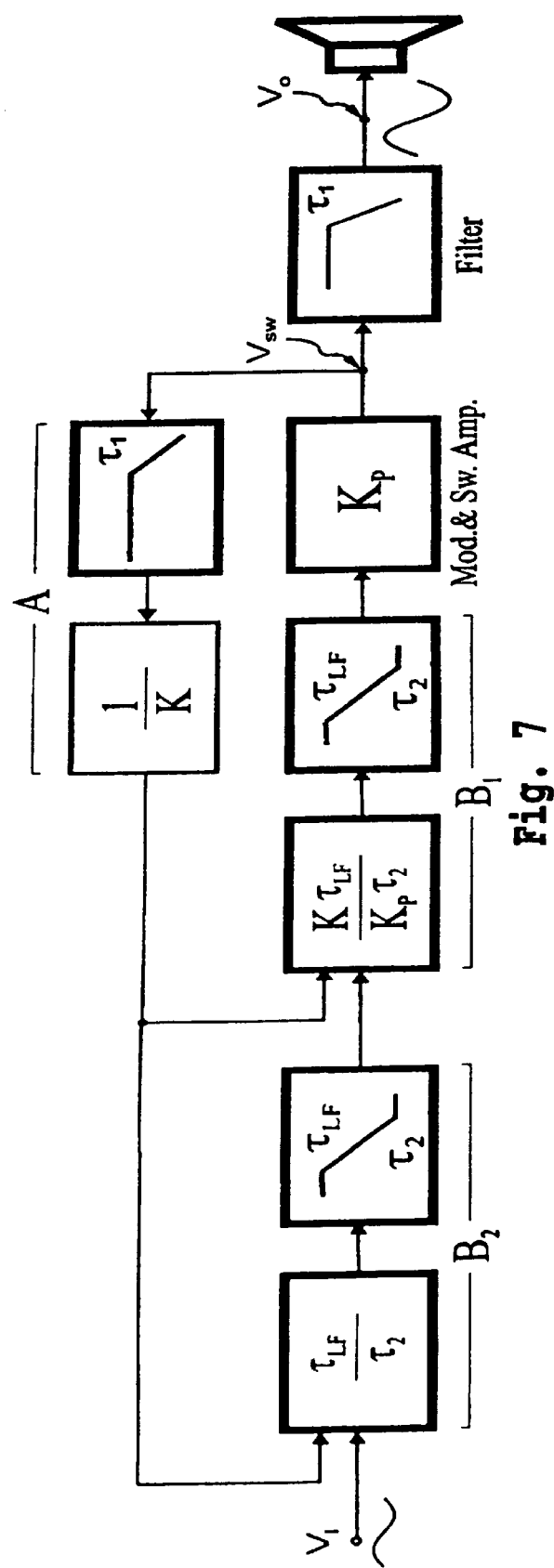
FIG. 7 shows a detail of a preferred embodiment of single feedback MECC.
Figure 9A:
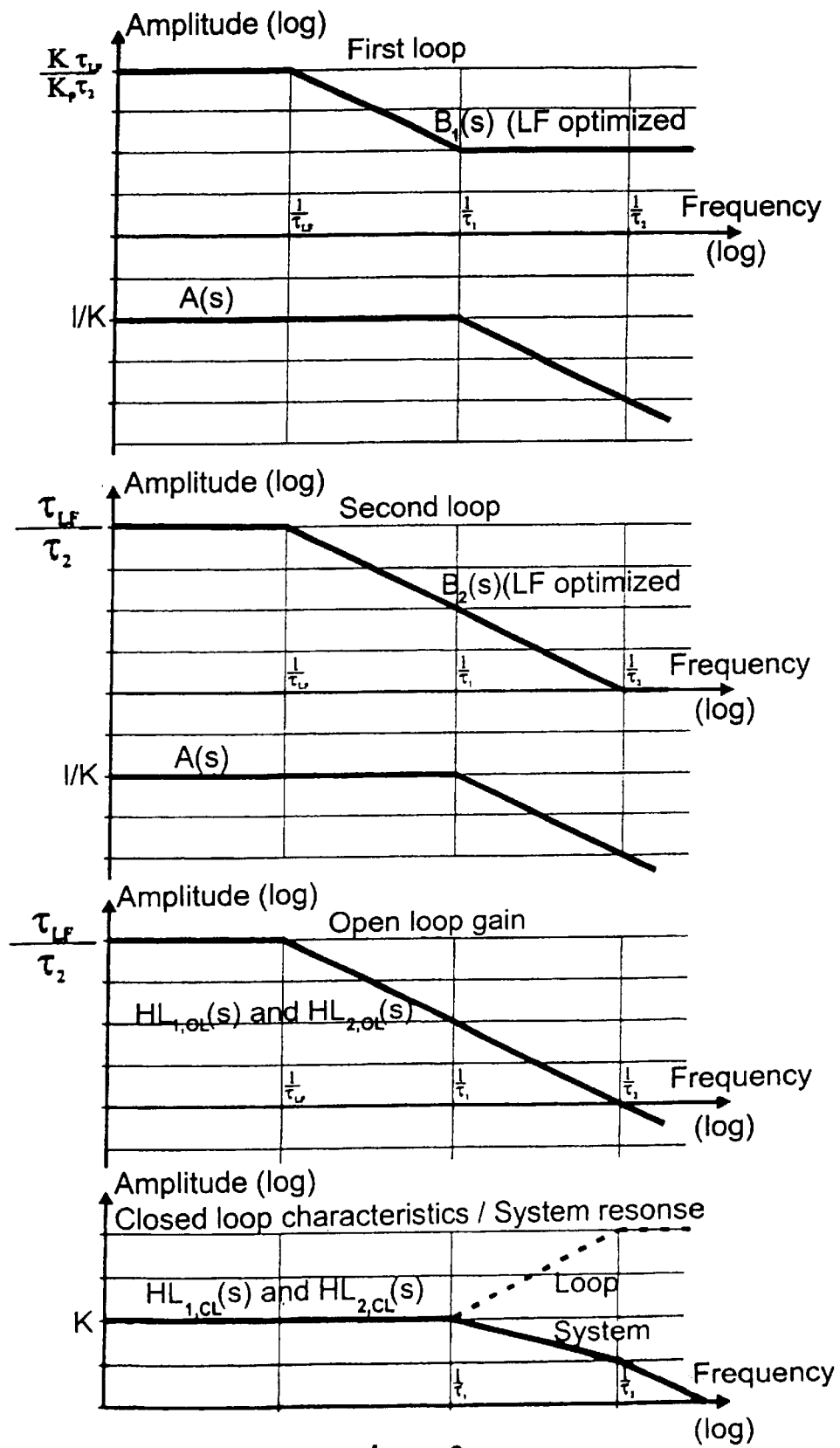
FIG. 9a and 9b show the loop characteristics for the two referred examples of the first two embodiments of the present invention, shown in FIG. 7 and FIG. 8.
Figure 9B:
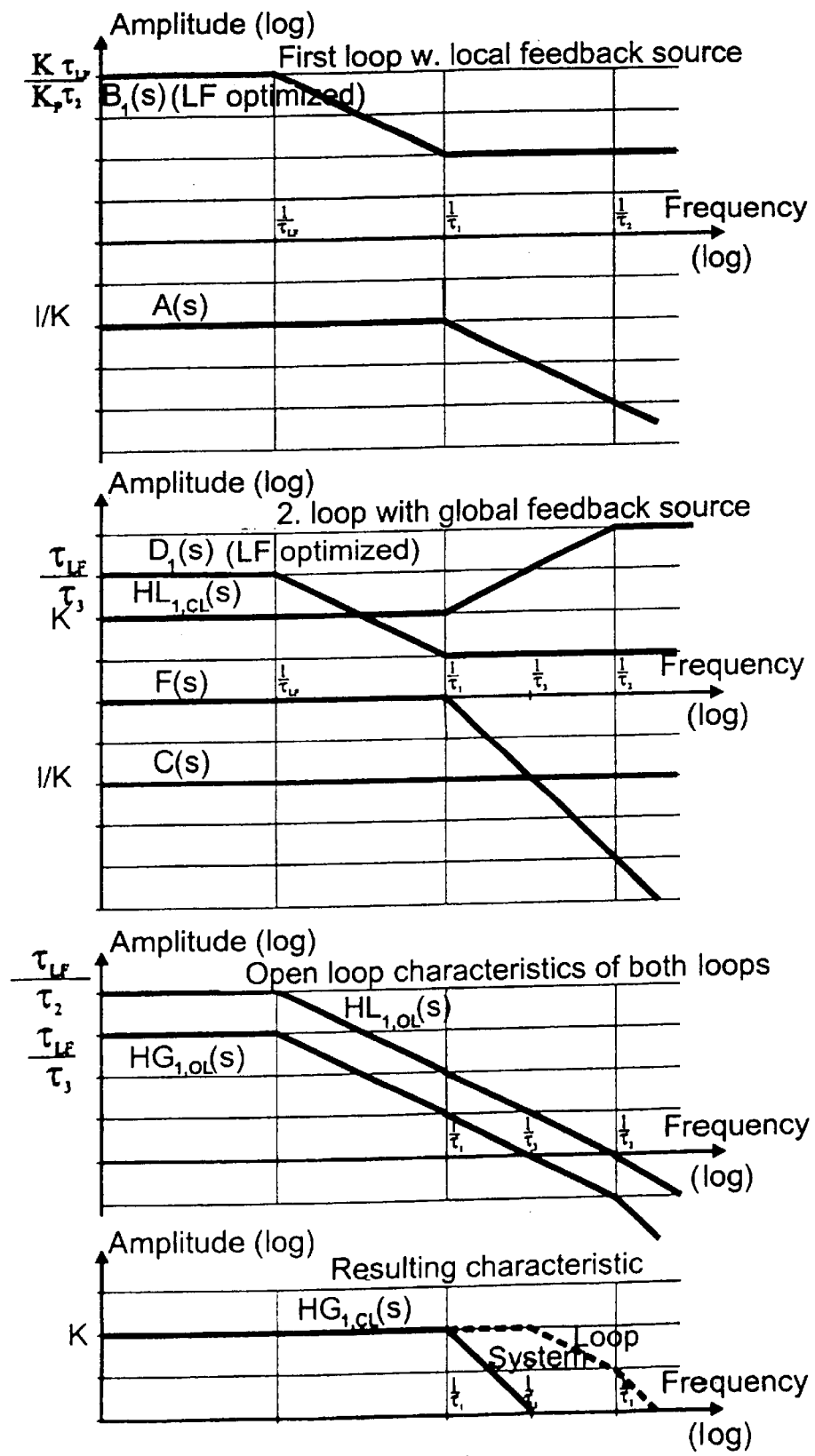

FIG. 7a and 7b show more specific double loop examples of both the single and dual feedback MECC embodiments. The design procedure of each loop is given in FIG. 9a and 9b respectively. Compared with the general design procedure, the LF performance has been optimized such that the equivalent loop gain in both loops is significantly increased at lower frequencies compared to the general approach. Table 1 gives example parameter values relative to the amplifier bandwidth.

TABLE 1

| Parameter | Frequency (rel. to bandwidth) |
|---|---|
| $1/\tau_1$ | 2 |
| $1/\tau_2$ | 10 |
| $1/\tau_{LF}$ | 1/5 |

The enhanced cascade provides a significant improvement over a the single loop approaches known in the art, with only a marginal increase in system complexity in terms of the added forward block $B_2$. Provided that the reconstruction filter is reasonably linear, the local feedback MECC embodiment can realize high end specifications. Further improvement may be realized by adding blocks equal to $B_2$. Alternative use of this first embodiment of the invention is to drive loudspeakers directly without reconstruction filter.

FIG. 7b provides an example of an embodiment of dual feed-back Multivariable Enhanced Cascade Control (MECC) with one local and one global loop, both closely connected. Compared to the general design procedure specified in FIG. 6 both loops have been LF optimized to significantly increase the loop gain in both loops at lower frequencies. Table 2 gives examples of parameter values relative to the amplifier bandwidth.

TABLE 2

| Parameter | Frequency (rel. to bandwidth) |
|---|---|
| $1/\tau_1$ | 2 |
| $1/\tau_2$ | 10 |
| $1/\tau_3$ | 4 |
| $1/\tau_{LF}$ | 1/5 |

Figure 8:
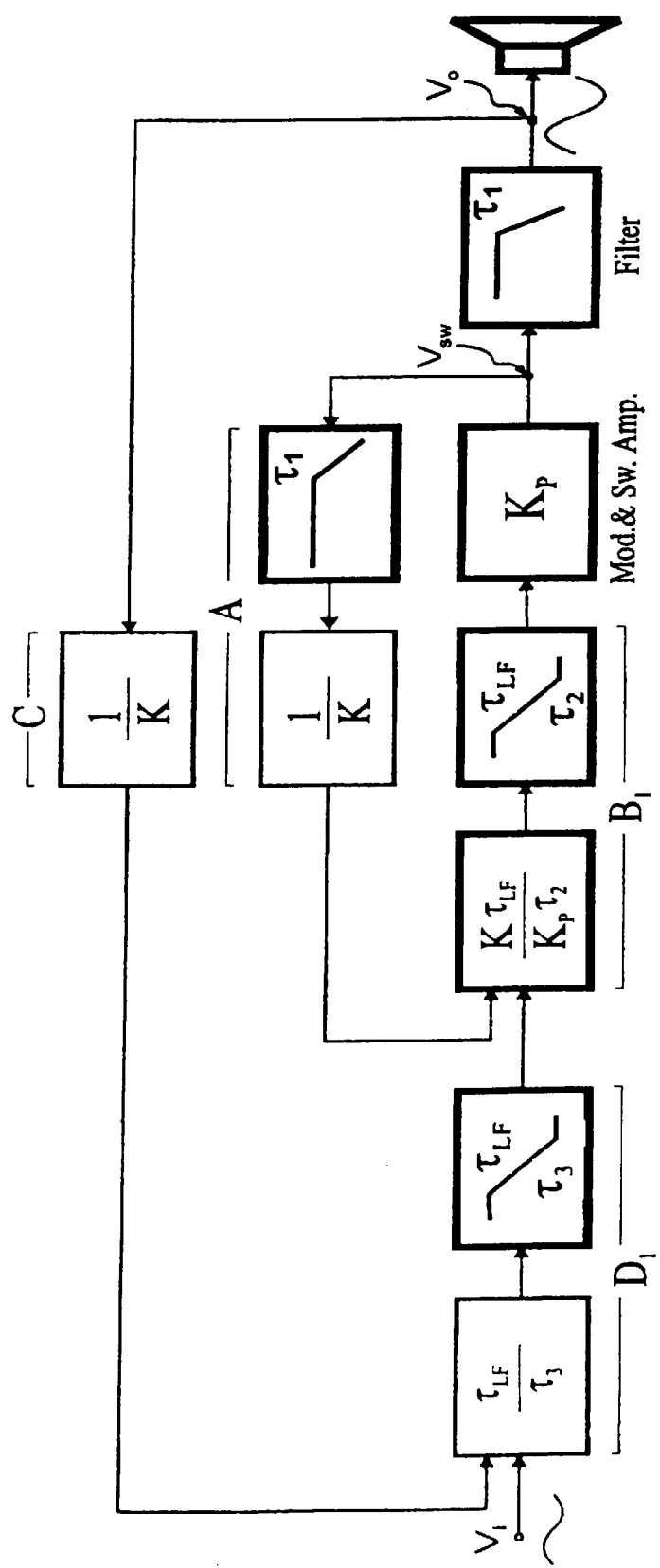
FIG. 8 shows a detail of a preferred example of the second embodiment of the invention, the dual feedback Multivariable Enhanced Cascade Controller (MECC).

In order to clarify the significant advantages of the dual feedback MECC digital power amplifier over prior art, the embodiment in FIG. 8 has been implemented in two higher power examples, one to cover the full audio bandwidth of 20 kHz utilizing a 250 kHz switching frequency, and one example covering a reduced bandwidth of 4 kHz, utilizing a 50 kHz switching frequency.

Figure 14A:
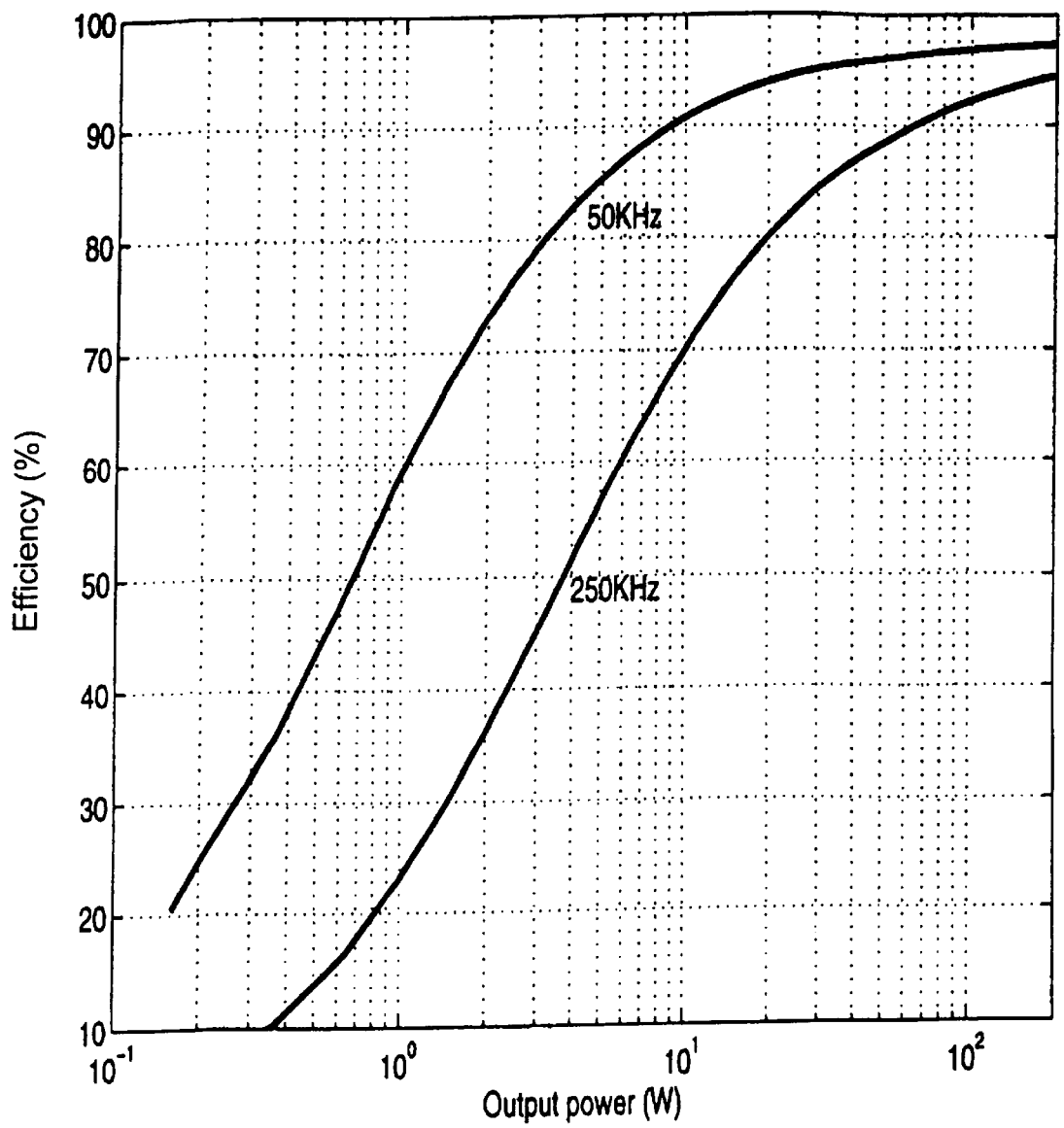
FIGS. 14(a)–(c) illustrate various performance specifications for an implemented example embodiment of the invention with a 250W maximal power handling capability.
Figure 14B:
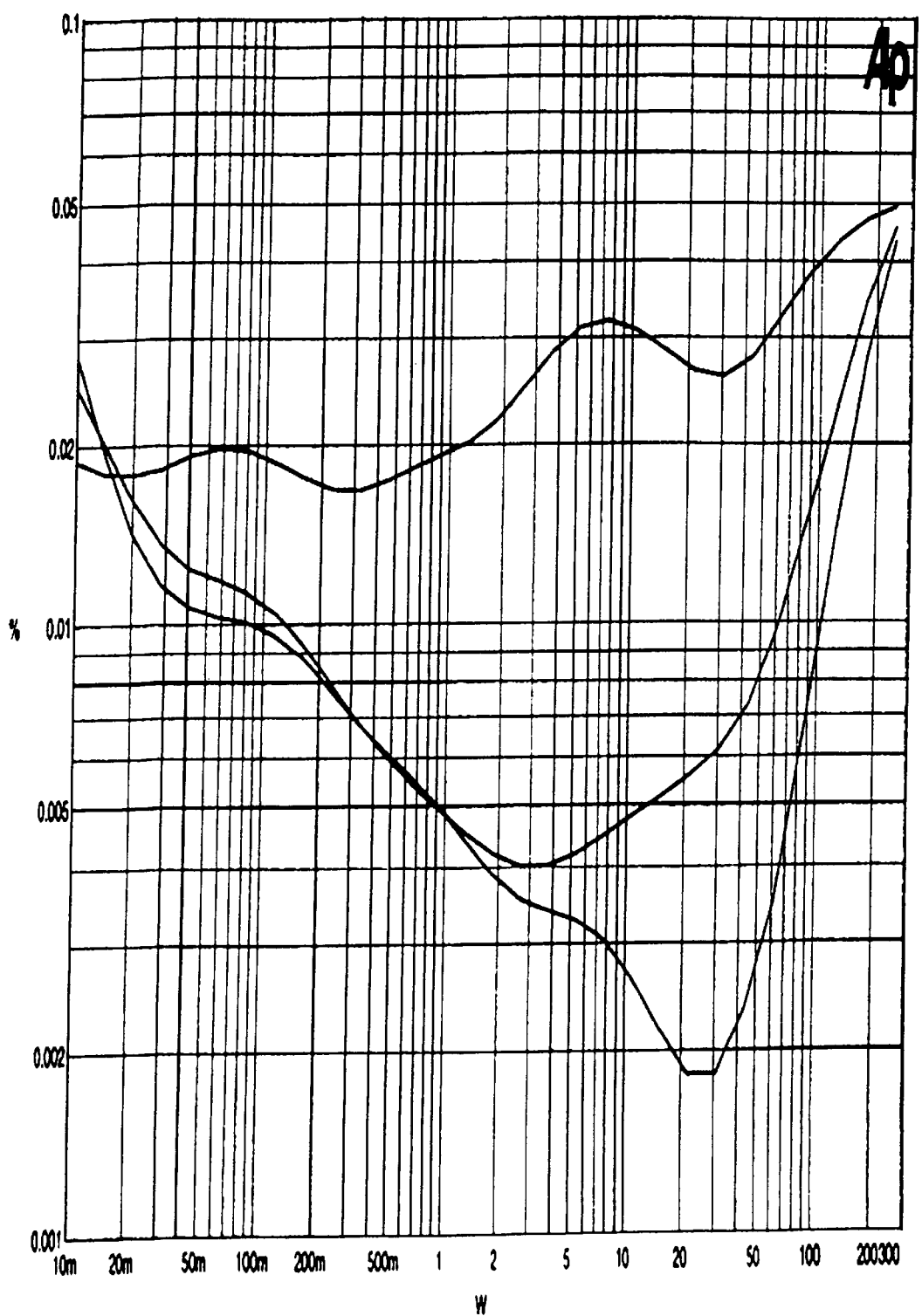
Figure 14C:
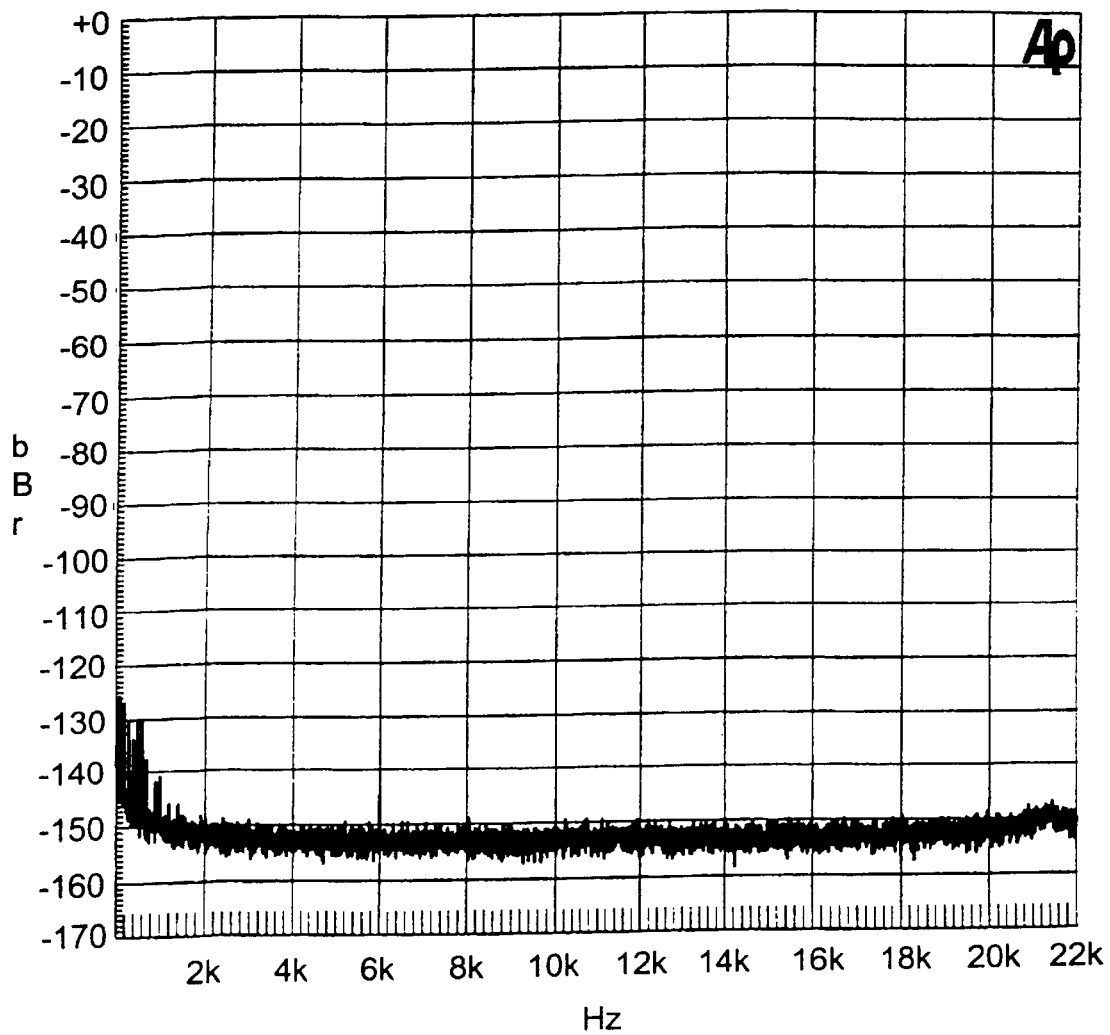

It should be emphasized that the chosen parameters are only illustrative, and that the MECC digital power amplifier is well performing on a much wider range of output powers and bandwidths. FIGS. 14(a)–(c) illustrate various key specifications for the given example, and the results obtained are summarized in Table 3. If further improvements are desired, one preferred approach is to use a double local loop by simple addition of a B forward block.

TABLE 3

| Specification | Measurement |
|---|---|
| Max. power | 250 W |
| Bandwidth | 20kHz/4kHz |
| THD + N (1KHz, 1W) | <0.01% |

TABLE 3-continued

| Specification | Measurement |
| --- | --- |
| THD + N (20Hz–20KHz) | <0.05% |
| Intermodulation distortion (IMD) | <0.01% |
| Idle noise (RMS) within bandwidth | 70 μV |
| Dynamic range | 115 dB |
| Power Stage Efficiency (250kHz/ 50kHz - switching frequency) | 92%/96% |

In general no prior art approach yields a comparable combination of fidelity, efficiency, and low complexity.

What is claimed is:

1. Pulse modulation power amplifier for the audio frequency range, comprising: a pulse modulator, and a switching stage for amplifying the modulated signal, the output of which is low pass filtered in a demodulation filter for obtaining an analog output to feed to a consumer, wherein a first negative feedback is introduced from the switching stage output to one or several feedback loops feeding into one or several forward paths preceding the modulator, at least one of said feedback loops comprising a feedback path with a phase characteristic such that a pole in the demodulation filter is compensated.

2. A power amplifier according to claim 1, wherein a single feedback path is used for all feedback loops.

3. A power amplifier according to claim 2, wherein each feedback loop has stable first order open loop characteristics.

4. A power amplifier according to claim 1, wherein a second feedback is established from the output of the demodulation filter to one or several forward paths.

5. A power amplifier according to claim 4, wherein said first feedback includes at least one feedback loop from the switching stage to a first group of at least one forward path, and said second feedback includes at least one feedback loop from the demodulation filter output to a second group of at least one forward path, preceding said first group.

6. A power amplifier according to claim 5, wherein a single feedback path is used for all feedback loops in said second feedback.

7. A power amplifier according to claim 6, wherein each loop has stable first order open loop characteristics.

8. A power amplifier according to claim 1, wherein the pulse modulator is a controlled self-oscillating modulator comprising a non-hysteresis comparator for pulse modulation and a higher order oscillating loop realized by means of at least two poles.

9. A power amplifier according to claim 1, wherein the pulse modulator is a carrier based pulse modulator.

10. A power amplifier according to claim 1, further comprising: additional secondary filtering circuitry at the amplifier output for further elimination of switching components.

11. A power amplifier according to claim 1, further comprising: an input filter to shape the overall amplifier response in frequency and time.

12. A pulse modulation power amplifier for the audio frequency range, comprising: a pulse modulator, and a switching stage for amplifying the modulated signal, the output of which is low pass filtered in a demodulation filter for obtaining an analog output to feed to a consumer, wherein a first negative feedback is introduced from the switching stage output to one or several forward paths preceding the modulator, and wherein a second feedback is established from the output of the demodulation filter to one or several forward paths.

13. A power amplifier according to claim 12, wherein said first feedback includes at least one feedback loop from the switching stage to a first group of at least one forward path, and said second feedback includes at least one feedback loop from the demodulation filter output to a second group of at least one forward path, preceding said first group.

14. A power amplifier according to claim 13, wherein a single feedback path is used for all feedback loops in said first feedback.

15. A power amplifier according to claim 14, wherein each loop has stable first order open loop characteristics.

16. A power amplifier according to claim 13, further wherein a single feedback path is used for all feedback loops in said second feedback.

17. A power amplifier according to claim 16, wherein each loop has stable first order open loop characteristics.

18. A power amplifier according to claim 12, wherein the pulse modulator is a controlled self-oscillating modulator, comprising a non-hysteresis comparator for pulse modulation and a higher order oscillating loop realized by means of at least two poles.

19. A power amplifier according to claim 12, wherein the pulse modulator is a carrier based pulse modulator.

20. A power amplifier according to claim 12, further comprising: additional secondary filtering circuitry at the amplifier output for further elimination of switching components.

21. A power amplifier according to claim 12, further comprising: an input filter to shape the overall amplifier response in frequency and time.

22. A controlled self-oscillating modulator comprising a non-hysteresis comparator for pulse modulation of a switching stage, and a voltage feedback loop from the switching stage to the comparator, said feedback loop securing stable oscilating conditions by means of at least two poles, wherein said feedback loop comprises a feedback path providing a feedback signal to a forward path, said feedback signal being superposed with a reference signal in the forward path, said feedback path comprising at least one pole, and said forward path comprising at least one pole.

23. A controlled self-oscillating modulator according to claim 22, wherein said feedback path comprises at least two poles, one of said poles compensating a pole in a demodulation filter connected to the switching stage.

24. A controlled self-oscillating modulator according to claim 23, wherein said feedback path and said forward path each further comprise a ploe at the desired oscillating frequency.

* * * * *